(12) United States Patent
Kim

(10) Patent No.: US 9,818,936 B2
(45) Date of Patent: Nov. 14, 2017

(54) METHOD FOR FABRICATING SEMICONDUCTOR DEVICE

(71) Applicant: SK hynix Inc., Icheon-Si (KR)

(72) Inventor: Sang-Soo Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/343,014

(22) Filed: Nov. 3, 2016

(65) Prior Publication Data

US 2017/0236999 A1   Aug. 17, 2017

(30) Foreign Application Priority Data

Feb. 16, 2016   (KR) .................. 10-2016-0017643

(51) Int. Cl.
    *H01L 21/00*   (2006.01)
    *H01L 43/12*   (2006.01)
    *H01L 43/02*   (2006.01)
    *H01L 27/22*   (2006.01)

(52) U.S. Cl.
    CPC ............ *H01L 43/12* (2013.01); *H01L 27/224* (2013.01); *H01L 43/02* (2013.01)

(58) Field of Classification Search
    None
    See application file for complete search history.

(56) References Cited

U.S. PATENT DOCUMENTS 6,326,293 B1 * 12/2001 Fang .................. H01L 21/7684
                                                    257/752
6,376,376 B1   4/2002 Lim et al.
2010/0240189 A1 * 9/2010 Jeong .................. H01L 21/7684
                                                    438/385
2011/0097896 A1 * 4/2011 Daamen .............. H01L 21/7684
                                                    438/643
2011/0306173 A1 * 12/2011 Bae ......................... H01L 45/06
                                                    438/381
2012/0305522 A1 * 12/2012 Park ....................... H01L 45/06
                                                    216/13
2014/0370705 A1 * 12/2014 Zhang ..................... H05K 3/00
                                                    438/675

FOREIGN PATENT DOCUMENTS

KR   10-2007-0008118 A   1/2007

* cited by examiner

*Primary Examiner* — Angel Roman
(74) *Attorney, Agent, or Firm* — Perkins Coie LLP

(57) ABSTRACT

A method for fabricating a semiconductor device includes: forming an inter-layer dielectric layer and a sacrificial layer over a substrate so that the sacrificial layer covers the inter-layer dielectric layer; forming a conductive pattern that is coupled with a portion of the substrate while penetrating through the inter-layer dielectric layer and the sacrificial layer; protruding a first portion of the conductive pattern by removing the sacrificial layer while maintaining a second portion of the conductive pattern inside the inter-layer dielectric layer; oxidizing the protruded first portion of the conductive pattern without oxidizing the second portion of the conductive pattern; removing the oxidized first portion of the conductive pattern to expose a top of the second portion of the conductive pattern; and forming a variable resistance element on top of the conductive pattern to couple a bottom of the variable resistance element with the top of the second portion of the conductive pattern.

18 Claims, 8 Drawing Sheets

METHOD FOR FABRICATING SEMICONDUCTOR DEVICE

CROSS-REFERENCE TO RELATED APPLICATIONS

This patent document claims the priority and benefits of Korean Patent Application No. 10-2016-0017643, entitled "METHOD FOR FABRICATING SEMICONDUCTOR DEVICE" and filed on Feb. 16, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document are directed to a method for fabricating a semiconductor device that may obtain the characteristics of a variable resistance element with a low fabrication process difficulty.

In accordance with an implementation, a method for fabricating a semiconductor device includes: forming an inter-layer dielectric layer and a sacrificial layer over a substrate so that the sacrificial layer covers the inter-layer dielectric layer; forming a conductive pattern that is coupled with a portion of the substrate while penetrating through the inter-layer dielectric layer and the sacrificial layer; protruding a first portion of the conductive pattern by removing the sacrificial layer while maintaining a second portion of the conductive pattern inside the inter-layer dielectric layer; oxidizing the protruded first portion of the conductive pattern without oxidizing the second portion of the conductive pattern; removing the oxidized first portion of the conductive pattern to expose a top of the second portion of the conductive pattern; and forming a variable resistance element on top of the conductive pattern to couple a bottom of the variable resistance element with the top of the second portion of the conductive pattern.

Implementations of the above method may include one or more the following.

The forming of the conductive pattern may include: forming an opening by selectively etching the inter-layer dielectric layer and the sacrificial layer; forming a conductive material in a thickness that the opening is sufficiently filled; and polishing the conductive material until the sacrificial layer is exposed. The sacrificial layer may have substantially the same polishing rate as the conductive material. The conductive material may include a metal, and the sacrificial layer includes a nitride of the metal. The sacrificial layer may have a different etch rate from the conductive pattern and the inter-layer dielectric layer. The width of a lower surface of the variable resistance element may be longer than the width of an upper surface of the second portion of the conductive pattern. The variable resistance element may include: a free layer having a variable magnetization direction, a pinned layer having a fixed magnetization direction, and a tunnel barrier layer interposed between the free layer and the pinned layer. The second portion of the conductive pattern and the inter-layer dielectric layer may have planarized upper surfaces. The oxidizing of the protruded first portion of the conductive pattern may be performed concurrently with a process of removing the sacrificial layer through natural oxidation.

In accordance with another implementation, a method for fabricating a semiconductor device includes: forming an inter-layer dielectric layer a substrate; forming a sacrificial layer over the inter-layer dielectric layer; forming a primary bottom electrode that is coupled with a portion of the substrate while penetrating through the inter-layer dielectric layer and the sacrificial layer; protruding a portion of the primary bottom electrode by removing the sacrificial layer; oxidizing the protruded portion of the primary bottom electrode; forming a bottom electrode of a variable resistance element by removing the oxidized portion of the primary bottom electrode; and forming the other constituent elements of the variable resistance element that is coupled with the bottom electrode over the bottom electrode.

Implementations of the above method may include one or more the following.

The forming of the primary bottom electrode may include: forming an opening by selectively etching the inter-layer dielectric layer and the sacrificial layer; forming a conductive material in a thickness that the opening is sufficiently filled; and polishing the conductive material until the sacrificial layer is exposed. The sacrificial layer may have substantially the same polishing rate as the conductive material. The conductive material may include a metal, and the sacrificial layer may include a nitride of the metal. The sacrificial layer may have a different etch rate from the primary bottom electrode and the inter-layer dielectric layer. The width of a lower surface of the other constituent elements of the variable resistance element may be longer than the width of an upper surface of the bottom electrode. The other constituent elements of the variable resistance element may include: a free layer having a variable magnetization direction, a pinned layer having a fixed magnetization direction, and a tunnel barrier layer interposed between the free layer and the pinned layer. The bottom electrode and the inter-layer dielectric layer may have planarized upper surfaces. The oxidizing of the protruded portion of the primary bottom electrode may be performed concurrently with a process of removing the sacrificial layer through natural oxidation.

In accordance with an implementation, an electronic device includes: a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell Implementations of the above electronic device may include one or more the following.

The inter-layer dielectric layer includes a first inter-layer dielectric layer formed over the substrate and a second inter-layer dielectric layer formed over the first inter-layer dielectric layer; and the bottom electrically conducting structure formed in the opening of the inter-layer dielectric layer includes a first bottom electrically conducting plug formed in the first inter-layer dielectric layer and a second bottom electrically conducting plug formed on the first bottom electrically conducting plug and located in the second inter-layer dielectric layer to that a top surface of the second inter-layer dielectric layer and a top surface of the second bottom electrically conducting pug collectively provide the continuum surface over which the magnetic memory cell is formed to fully cover the top surface of the second bottom electrically conducting plug and to additionally cover a surrounding area of the top surface of the second inter-layer dielectric layer that surrounds the second bottom electrically conducting plug. The magnetic memory cell includes an electrode that is formed below the variable resistance structure and is above the bottom electrically conducting structure to fully cover the top surface of the bottom electrically conducting structure and to additionally cover a surrounding area of the top surface of the inter-layer dielectric layer that surrounds the bottom electrically conducting structure These and other aspects, implementations and associated advantages are described in greater detail in the drawings, the description and the claims.

DETAILED DESCRIPTION

Figure 1:
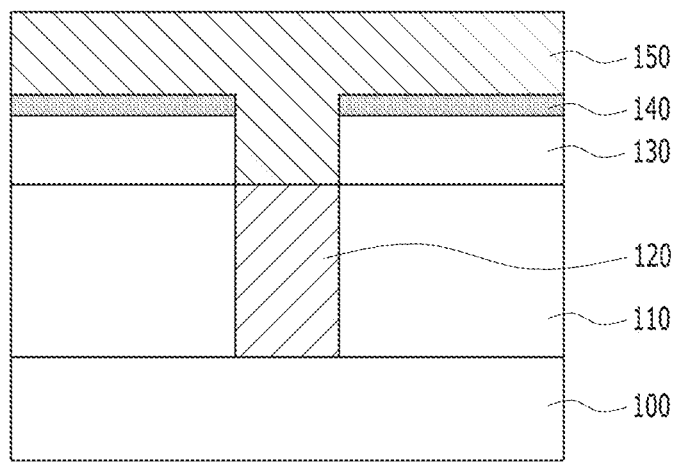
FIGS. 1 to 5 are cross-sectional views illustrating an example of a semiconductor device and an example of a method for fabricating the semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before the description of the drawings, a semiconductor device in accordance with an implementation is briefly described. The semiconductor device in accordance with the implementation may include a variable resistance element that switches between different resistance levels when a switching voltage or current is applied to the semiconductor device. Since the variable resistance element may store different data according to the resistance level, it may function as a memory cell. The variable resistance element may include a multilayer structure of different layers of materials in implementations. In particular, the variable resistance element in accordance with one implementation may include a Magnetic Tunnel Junction (MTJ) structure that includes a pinned layer including a ferromagnetic material and having a fixed magnetization direction, a free layer including a ferromagnetic material and having a variable magnetization direction, and a tunnel barrier layer interposed between the pinned layer and the free layer. When the magnetization directions of the pinned layer and the free layer are parallel to each other, the variable resistance element is in a low resistance level, and it may store a data of '1', for example. Conversely, when the magnetization directions of the pinned layer and the free layer are antiparallel with respect to each other, the variable resistance element is in a high resistance level, and it may store a data of '0', for example.

There are diverse conditions for satisfying the required characteristics of the variable resistance element. Particularly, it is important to acquire planarity of the layers to form the variable resistance element (e.g., a MTJ structure) to ensure desired characteristics of the variable resistance element. If a portion of the layers of the variable resistance element (e.g., a MTJ structure) is curved, the characteristics of the variable resistance element is or can be deteriorated. For example, when a tunnel barrier layer of a MTJ structure is formed on a surface that is not planar, the tunnel barrier layer becomes curved and the characteristics of the MTJ structure may be deteriorated due to theNeel Coupling phenomenon. According to the implementation, the characteristics of the variable resistance element can be improved by improving the shape of the structure under the MTJ structure to acquire planarity for the layers of the MTJ structure.

FIGS. 1 to 5 are cross-sectional views illustrating an example of a semiconductor device and an example for a method for fabricating the semiconductor device in accordance with an implementation.

Referring to FIG. 1, a substrate 100 is provided on which a predetermined lower structure (not shown) is formed and a variable resistance element will be formed. For example, an access device (not shown) for controlling the supply of a voltage or current to the variable resistance element to be formed on the substrate 100 may be formed in the substrate 100. A transistor or a diode may be used as the access device for activating or selecting the variable resistance element.

Subsequently, a first inter-layer dielectric layer 110 may be formed over the substrate 100 and a bottom contact plug 120 for the variable resistance element may be formed over the substrate 100 and may penetrate through the first inter-layer dielectric layer 110. The first inter-layer dielectric layer 110 may include diverse dielectric materials such as a silicon oxide, a silicon nitride, or a combination thereof. The bottom contact plug 120 is a passage for supplying a current or voltage to the variable resistance element to be formed on the top of the bottom contact plug 120. The upper portion of the bottom contact plug 120 is coupled with the variable resistance element and the lower portion of the bottom contact plug 120 is coupled with the access device of the substrate 100. The bottom contact plug 120 may include a metal such as titanium (Ti) and tungsten (W), a metal nitride such as titanium nitride (TiN), tungsten nitride (WN) and tantalum nitride (TaN), or a combination thereof. The bottom contact plug 120 may be formed by selectively etching the first inter-layer dielectric layer 110 to form an opening that exposes a portion of the substrate 100, depositing a conductive material on the resultant structure in a thickness that the opening is sufficiently filled, and performing an etch-back process or a Chemical Mechanical Polishing (CMP) on the conductive material until the upper surface of the first inter-layer dielectric layer 110 is exposed.

Subsequently, a second inter-layer dielectric layer 130 and a sacrificial layer 140 are sequentially formed over the first inter-layer dielectric layer 110 and the bottom contact plug 120, and then an opening that exposes the bottom contact plug 120 is formed by selectively etching the sacrificial layer 140 and the second inter-layer dielectric layer 130. Next, a bottom electrode conductive layer 150 for the variable resistance element may be formed over the resultant structure in a thickness that the opening is sufficiently filled. The second inter-layer dielectric layer 130 provides a space where the bottom electrode 150 is to be formed. The second inter-layer dielectric layer 130 may include diverse dielectric materials such as a silicon oxide, a silicon nitride, or a combination thereof. The sacrificial layer 140 is a layer to be removed in a subsequent process. The sacrificial layer 140 may include a material having substantially the same polishing rate but having a different etch rate from the etch rates of the bottom electrode conductive layer 150 and the second inter-layer dielectric layer 130 under a predetermined wet or dry etch condition. For example, when the bottom electrode conductive layer 150 includes a metal such as tantalum (Ta) and titanium (Ti), the sacrificial layer 140 may include a nitride of the metal such as tantalum nitride (TaN) and titanium nitride (TiN). However, the present implementation is not limited to them, and the sacrificial layer 140 may include diverse metals or metal nitrides having the same and/or similar polishing rate, e.g., tantalum (Ta), tungsten (W), cobalt (Co), and titanium (Ti), while being different from the material of the bottom electrode conductive layer 150. The bottom electrode conductive layer 150 may be patterned in the subsequent process to function as a bottom electrode that forms the lowermost portion of the variable resistance element.

Figure 2:
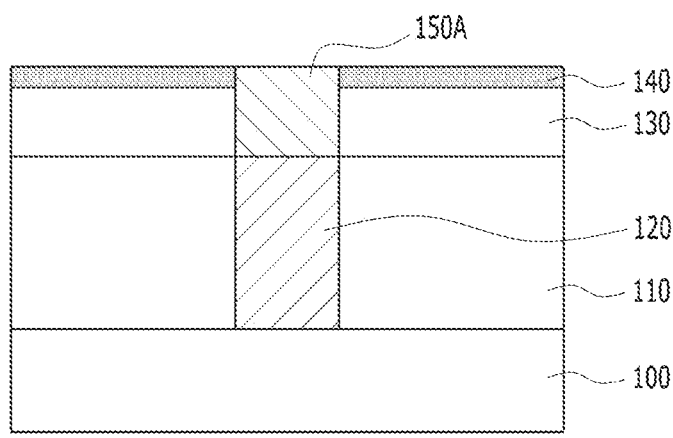

Referring to FIG. 2, the bottom electrode conductive layer 150 for the variable resistance element may be polished until the sacrificial layer 140 is exposed to forma primary bottom electrode 150A that has a top portion of its sidewalls to be surrounded by the sacrificial layer 140 and a bottom portion of its side walls to be surrounded by the second inter-layer dielectric layer 130. Since the sacrificial layer 140 and the bottom electrode conductive layer 150 have substantially the same polishing rate, the resultant primary bottom electrode 150A may have a planar upper surface, and furthermore, the primary bottom electrode 150A may have a planar upper surface that is co-planar with a planar upper surface of the sacrificial layer 140 remains after the polishing process. Although the drawing shows that the sidewalls of the primary bottom electrode 150A are aligned with the sidewalls of the bottom contact plug 120, there may be other embodiments as well. In other words, since the primary bottom electrode 150A is patterned in a different process from the process for forming the bottom contact plug 120, the sidewalls of the primary bottom electrode 150A may not necessarily be aligned with the sidewalls of the bottom contact plug 120.

Figure 3:
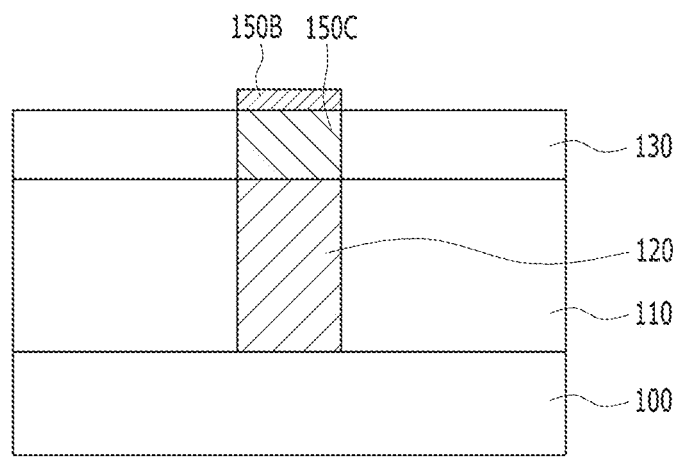

Referring to FIG. 3, in the next step of the fabrication process, the sacrificial layer 140 may be removed. The sacrificial layer 140 may be removed through a wet etch process or a dry etch process. When the sacrificial layer 140 is formed of a material having a different etch rate from the etch rates of the bottom electrode conductive layer 150 and the second inter-layer dielectric layer 130, the sacrificial layer 140 alone may be selectively removed while minimizing the loss of the primary bottom electrode 150A and the second inter-layer dielectric layer 130. As a result, a portion of the primary bottom electrode 150A may be protruded upward over the second inter-layer dielectric layer 130 (refer to a reference numeral '150B').

Herein, the protrusion 150B of the primary bottom electrode 150A may be oxidized naturally in the process of removing the sacrificial layer 140, or it may be oxidized through an arbitrary oxidation process that is performed after the removal of the sacrificial layer 140. As a result, the protrusion 150B of the primary bottom electrode 150A may include a metal oxide. The other portion of the primary bottom electrode 150A excluding the protrusion 150B may not be oxidized. The portion of the primary bottom electrode 150A that is not oxidized is referred to as a bottom electrode 150C. The bottom electrode 150C is used as a portion of the variable resistance element to be formed on the top. The bottom electrode 150C is disposed in the lowermost portion of the variable resistance element and couples the bottom contact plug 120 with the variable resistance element as well as helping a layer positioned over the bottom electrode 150C grow and have a target crystalline structure.

Figure 4:
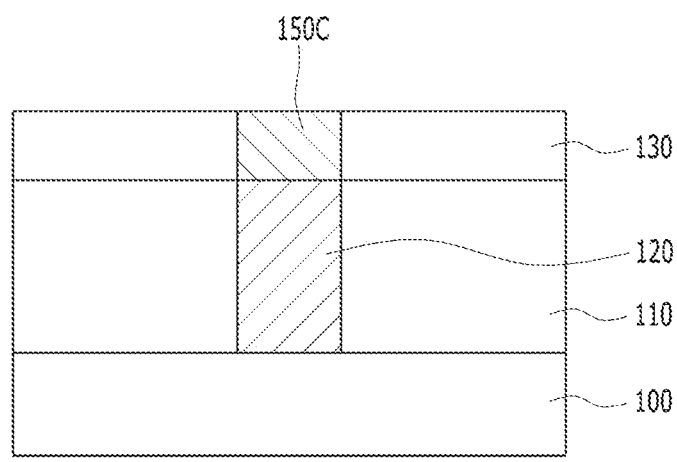

Referring to FIG. 4, the protrusion 150B over the bottom electrode 150C may be removed. The protrusion 150B may be removed through a wet etch process or a dry etch process. Particularly, the protrusion 150B may be removed through a Radio Frequency (RF) etch process. As a result of removing the protrusion 150B, the bottom electrode 150C of which sidewalls are surrounded by the second inter-layer dielectric layer 130 and upper surface is planarized may be formed. The upper surface of the bottom electrode 150C may be planarized in continuum with the upper surface of the second inter-layer dielectric layer 130.

Figure 5:
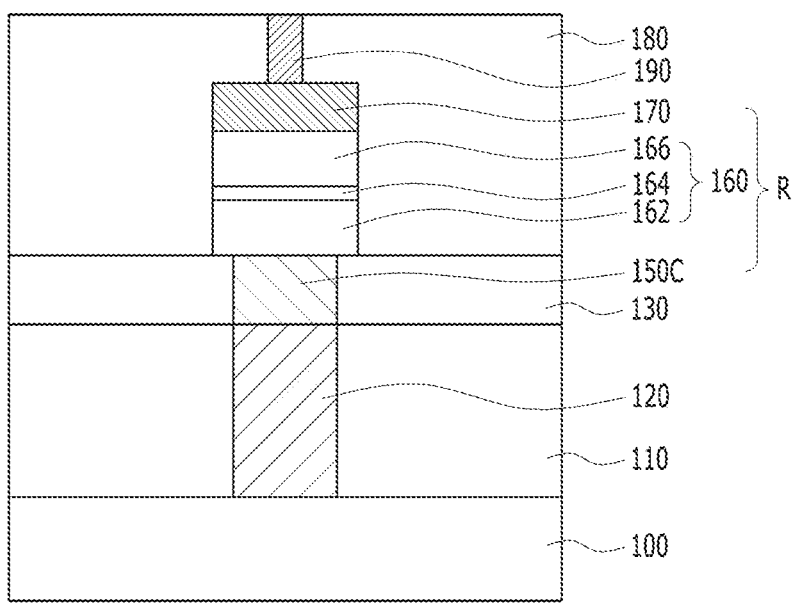

Referring to FIG. 5, the other portion of the variable resistance element coupled with the bottom electrode 150C, which includes an MTJ structure 160 and a top electrode 170, may be formed over the substrate structure obtained from the process of FIG. 4 which has a planar upper surface.

The MTJ structure 160 may include a free layer 162 including a ferromagnetic material and having a variable magnetization direction, a pinned layer 166 including a ferromagnetic material and having a fixed magnetization direction, and a tunnel barrier layer 164 interposed between the free layer 162 and the pinned layer 166. The upper and lower positions of the free layer 162 and the pinned layer 166 may be switched with each other. Since the free layer 162 may store different data according to the magnetization direction, it may be called a storage layer. The pinned layer 166 is a layer contrasted with the free layer 162, and the pinned layer 166 may be called a reference layer. Each of the free layer 162 and the pinned layer 166 may be a single layer or a multi-layer which may be formed to include a material such as a Fe—Pt alloy, Fe—Pd alloy, Co—Pd alloy, Co—Pt alloy, Co—Fe alloy, Fe—Ni—Pt alloy, Co—Fe—Pt alloy, Co—Ni—Pt alloy, or Co—Fe—B alloy. The magnetization directions of the free layer 162 and the pinned layer 166 may be substantially perpendicular to the surface of the layers. The tunnel barrier layer 164 may change the magnetization direction of the free layer 162 by tunneling electrons during a data write operation of the variable resistance element. The tunnel barrier layer 164 may be a single layer or a multi-layer which may include a material such as aluminum oxide ($Al_2O_3$), magnesium oxide (MgO), calcium oxide (CaO), strontium oxide (SrO), titanium oxide (TiO), vanadium oxide (VO), or niobium oxide (NbO).

The top electrode 170 is disposed in the uppermost portion of the variable resistance element, and couples the variable resistance element with a top contact plug 190 that is disposed over the top electrode 170. The top electrode 170 may include diverse conductive materials such as metals and metal nitrides.

The MTJ structure 160 and the top electrode 170 may be formed by depositing material layers for forming the MTJ structure 160 and the top electrode 170 on the second inter-layer dielectric layer 130 and the bottom electrode 150C having the planar upper surface, and then selectively etching the material layers by using one mask. Herein, the width of the lower surface of the MTJ structure 160 may be equal to or longer than the width of the upper surface of the bottom electrode 150C. Accordingly, the MTJ structure 160 entirely covers the upper surface of the bottom electrode 150C. This may prevent a problem that a conductive byproduct generated from the bottom electrode 150C which is exposed during the etch process for forming the MTJ structure 160 and the top electrode 170 adheres to the sidewalls of the MTJ structure 160 and the top electrode 170 and functions as a leakage current passage. If there is any possible potential problem, the MTJ structure 160 may be curved because the MTJ structure 160 is disposed on the boundary between the bottom electrode 150C and the second inter-layer dielectric layer 130. However, since the bottom electrode 150C and the second inter-layer dielectric layer 130 have planar surfaces due to the processes described above with reference to FIGS. 1 to 4, the MTJ structure 160 may be protected from the problem of being curved.

As a result of the process described above, a variable resistance element R shown in FIG. 5 may be formed in a structure that the bottom electrode 150C, the MTJ structure 160, and the top electrode 170 are stacked. The variable resistance element R may further include one or more layers to improve the characteristics of the variable resistance element R or to ease the fabrication process.

Subsequently, a third inter-layer dielectric layer 180 that covers the MTJ structure 160 and the top electrode 170 is formed, and then the top contact plug 190 may be formed tocouple with the top electrode 170 while penetrating through the third inter-layer dielectric layer 180. The top contact plug 190 forms a passage for supplying a current or voltage to the variable resistance element. The lower portion of the top contact plug 190 may be coupled with the variable resistance element, and the upper portion of the top contact plug 190 may be coupled with predetermined lines (not shown). The top contact plug 190 may include a metal such as titanium (Ti) or tungsten (W), a metal nitride such as titanium nitride (TiN), tungsten nitride (WN), or tantalum nitride (TaN), or a combination thereof. The top contact plug 190 may be formed by selectively etching the third inter-layer dielectric layer 180 so as to form an opening that exposes the upper surface of the top electrode 170, depositing a conductive material over the resultant structure in a thickness that the opening is sufficiently filled, and performing an etch-back process or a Chemical Mechanical Polishing (CMP) process on the conductive material until the upper surface of the third inter-layer dielectric layer 180 is exposed.

As a result of the process described above, the semiconductor device illustrated in FIG. 5 may be obtained.

The semiconductor device and the method for fabricating the semiconductor device in accordance with the present implementation may prevent undesired conductive byproduct from being generated from the bottom electrode 150C because the MTJ structure 160 of the variable resistance element R covers the entire upper surface of the bottom electrode 150C. Furthermore, although the MTJ structure 160 is disposed on the boundary between the bottom electrode 150C and the second inter-layer dielectric layer 130, the MTJ structure 160 is formed on the planar surface. Therefore, it may be possible to acquire planarity of the layers that form the MTJ structure 160 and attain desired characteristics of the variable resistance element R.

Figure 6:
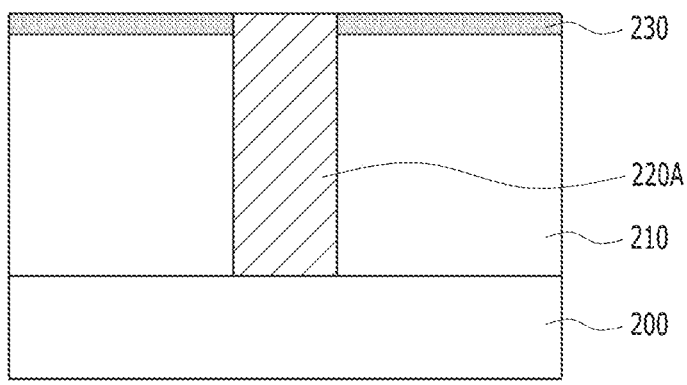
FIGS. 6 to 8 are cross-sectional views illustrating a semiconductor device and a method for fabricating the semiconductor device in accordance with another implementation.
Figure 7:
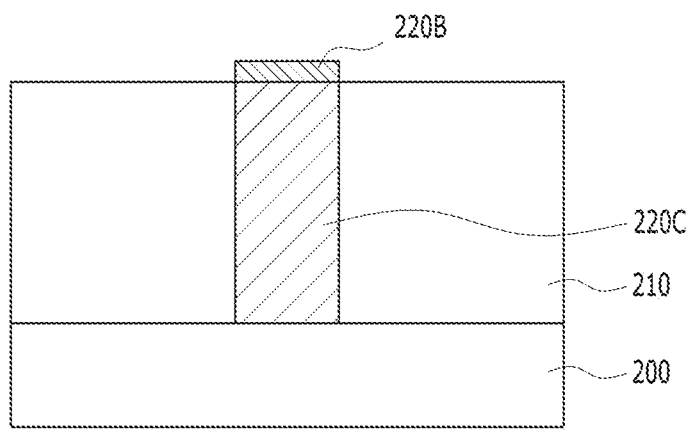
Figure 8:
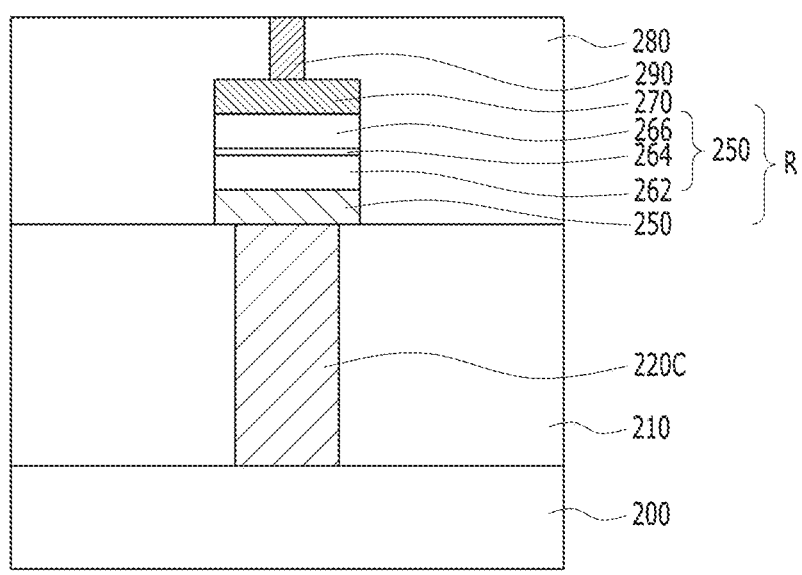

FIGS. 6 to 8 are cross-sectional views illustrating an example of a semiconductor device and an example of a method for fabricating the semiconductor device in accordance with another implementation. Herein, the semiconductor device fabrication method in accordance with this implementation is described focusing on the difference from the above-described embodiment illustrated in FIGS. 1-5.

Referring to FIG. 6, a first inter-layer dielectric layer 210 and a sacrificial layer 230 may be formed over a substrate 200 where a predetermined lower structure (not shown) is already formed.

Subsequently, a primary bottom electrode 220A may be formed to be coupled with a portion of the substrate 200 while penetrating through the sacrificial layer 230 and the first inter-layer dielectric layer 210. The primary bottom electrode 220A that is coupled with a portion of the substrate 200 while penetrating through the sacrificial layer 230 and the first inter-layer dielectric layer 210 may be formed. The primary bottom electrode 220A may be formed by selectively etching the first inter-layer dielectric layer 210 and the sacrificial layer 230 so as to form an opening that exposes a portion of the substrate 200, depositing a conductive material on the resultant substrate in a thickness that the opening is sufficiently filled, and polishing the conductive material until the upper surface of the sacrificial layer 230 is exposed. Herein, the sacrificial layer 230 is a layer to be removed in a subsequent process. The sacrificial layer 230 may include a material having substantially the same polishing rate but having a different etch rate from the etch rates of the primary bottom electrode 220A and the first inter-layer dielectric layer 210. To take an example, when the primary bottom electrode 220A includes a metal such as tantalum (Ta) and titanium (Ti), the sacrificial layer 230 may include a nitride of the metal such as tantalum nitride (TaN) and titanium nitride (TiN). As a result, the primary bottom electrode 220A may have a planar upper surface, and furthermore, the upper surface of the primary bottom electrode 220A may be planarized in continuum with the upper surface of the sacrificial layer 230.

Referring to FIG. 7, the sacrificial layer 230 may be removed, As the sacrificial layer 230 is removed, a portion of the primary bottom electrode 220A may be protruded upward above the first inter-layer dielectric layer 210 (refer to a reference numeral '220B').

Herein, the protrusion 220B of the primary bottom electrode 220A may be naturally oxidized in the process of removing the sacrificial layer 230, or it may be oxidized through an arbitrary oxidation process that is performed after the removal of the sacrificial layer 230. As a result, the protrusion 220B of the primary bottom electrode 220A may include a metal oxide. The other portion of the primary bottom electrode 220A excluding the protrusion 220B may not be oxidized. The portion of the primary bottom electrode 220A that is not oxidized is referred to as a bottom contact plug 220C, hereafter.

Referring to FIG. 8, the protrusion 220B over the bottom contact plug 220C may be removed. As a result of the process, the bottom contact plug 220C of which sidewalls are surrounded by the first inter-layer dielectric layer 210 and the upper surface is planarized in continuum with the upper surface of the first inter-layer dielectric layer 210 may be obtained.

Subsequently, a variable resistance element R, which includes a bottom electrode 250, an MTJ structure 260, and a top electrode 270, may be formed over the first inter-layer dielectric layer 210 and the bottom contact plug 220C that have planar upper surface. The variable resistance element R may be formed by depositing material layers for forming the bottom electrode 250, the MTJ structure 260, and the top electrode 270 over the bottom contact plug 220C and the first inter-layer dielectric layer 210, and selectively etching the material layers by using one mask. Herein, the width of the lower surface of the variable resistance element R may be equal to or longer than the width of the upper surface of the bottom contact plug 220C. Accordingly, the upper surface of the bottom contact plug 220C may be covered entirely without being exposed. Therefore, the conductive byproduct from the bottom contact plug 220C may adhere to the sidewalls of the variable resistance element R to thereby prevent the problem of a leakage current passage being formed. Also, since the layers that form the variable resistance element R are disposed over the planar upper surface, the problem of being curved on the boundary between the bottom contact plug 220C and the first inter-layer dielectric layer 210 may be solved.

Subsequently, after a second inter-layer dielectric layer 280 that covers the variable resistance element R is formed, a top contact plug 290 may be formed to be coupled with the top electrode 270 of the variable resistance element R while penetrating through the second inter-layer dielectric layer 280.

Through the process described above, the semiconductor device illustrated in FIG. 8 may be obtained.

According to the semiconductor device and the fabrication method thereof in accordance with the implementation, it is possible to block off desired conductive byproduct generated from the bottom contact plug 220C because the variable resistance element R covers all the upper surface of the bottom contact plug 220C. Furthermore, since the variable resistance element R is formed over the planar upper surface, it is possible to attain planarity for the layers that form the variable resistance element R and thus obtain desired characteristics of the variable resistance element R.

According to the implementation, a semiconductor device may obtain desired characteristics of a variable resistance element with a low fabrication process difficulty.

The above and other memory circuits or semiconductor devices based on the disclosed technology can be used in a range of devices or systems. FIGS. 9-13 provide some examples of devices or systems that can implement the memory circuits disclosed herein.

Figure 9:
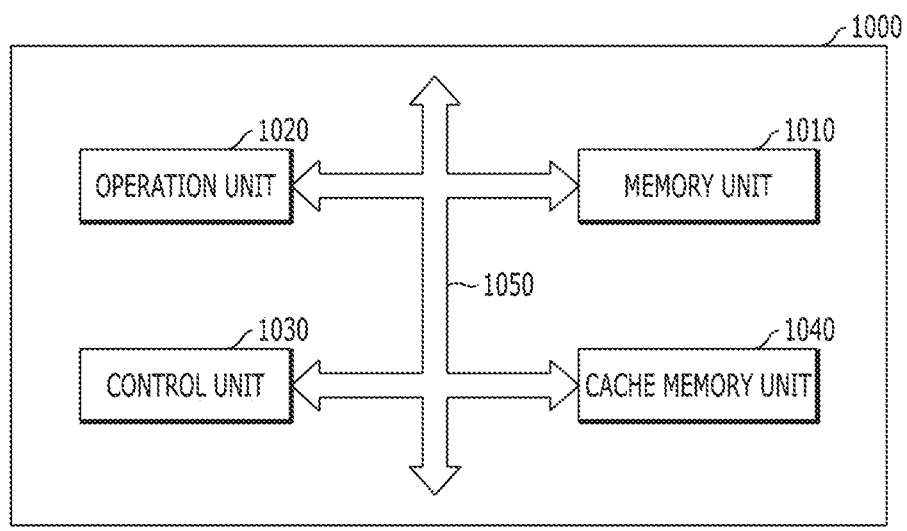
FIG. 9 illustrates a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
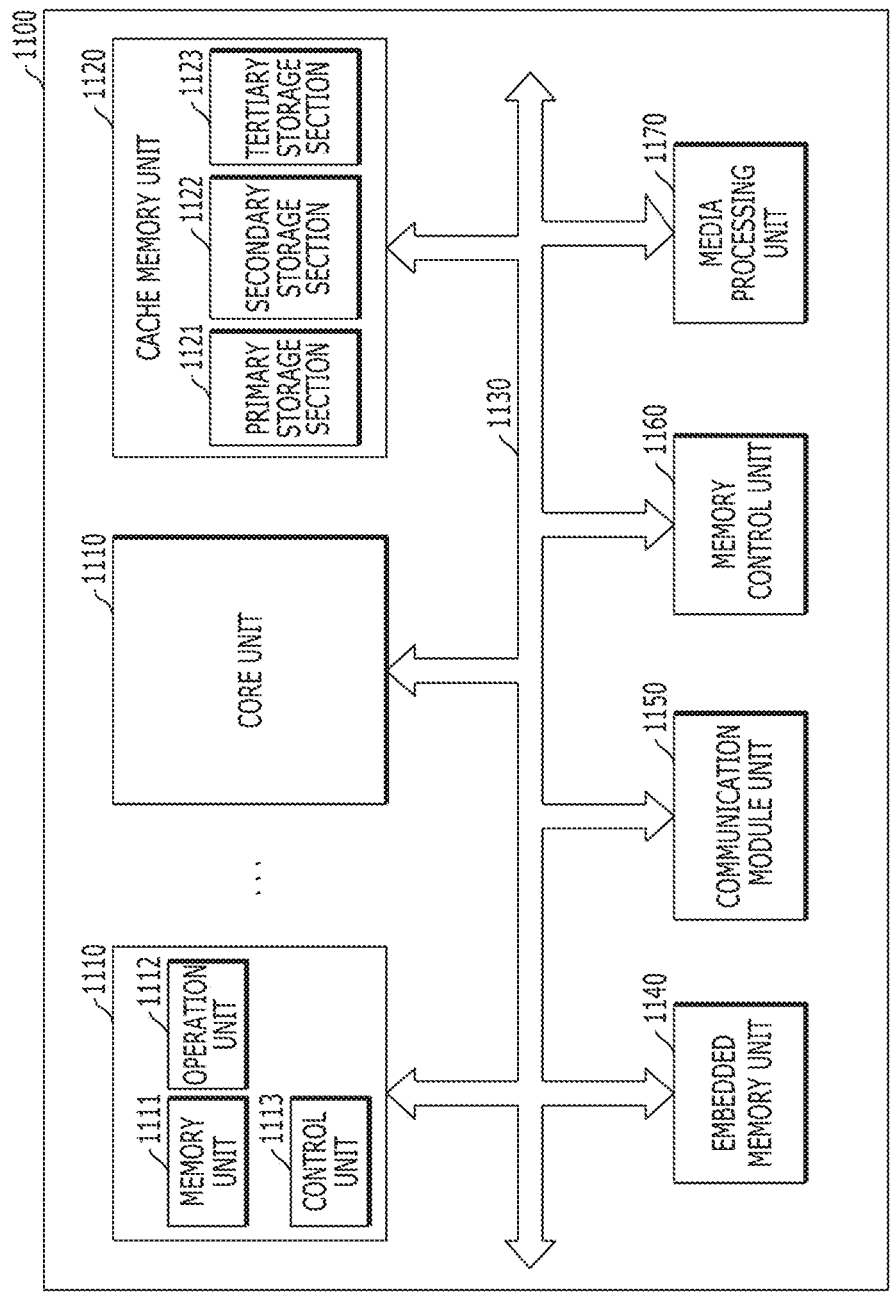
FIG. 10 illustrates a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the cache memory unit 1120 may be improved. As a consequence, operating characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
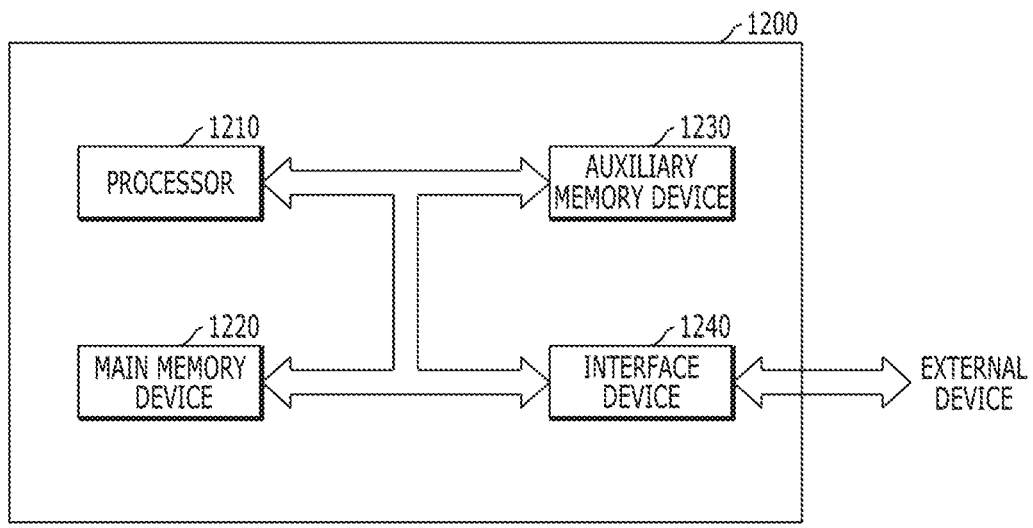
FIG. 11 illustrates a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
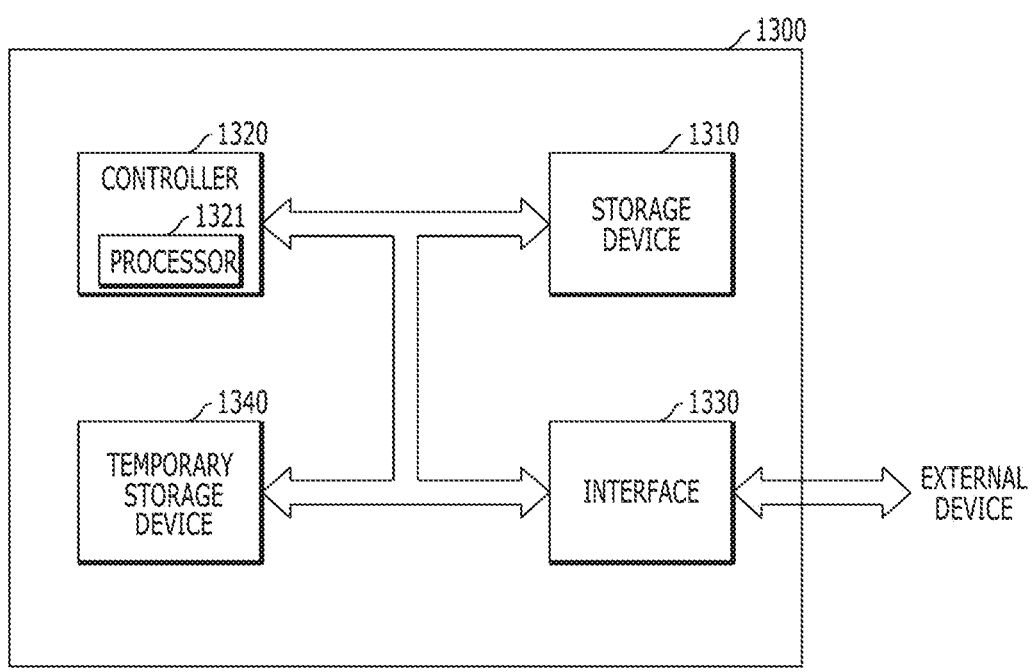
FIG. 12 illustrates a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the temporary storage device 1340 may be improved. As a consequence, operating characteristics and data storage characteristics of the data storage system 1300 may be improved.

Figure 13:
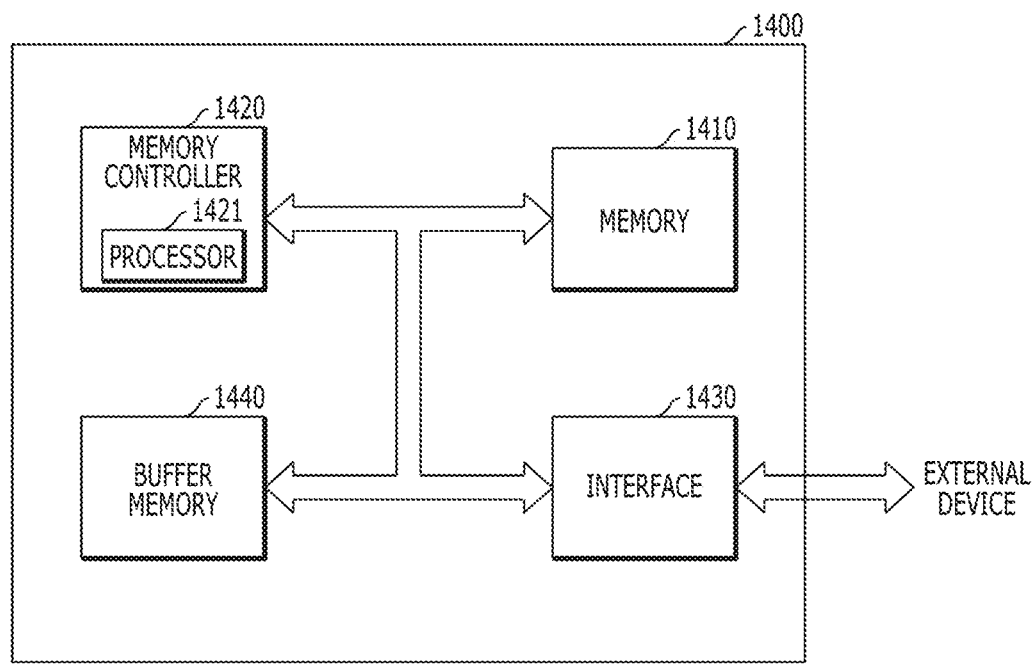
FIG. 13 illustrates a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first conductive pattern; a first selection element layer that is disposed over the first conductive pattern and has one or more first grooves overlapping the first conductive pattern; a first variable resistance layer whose side walls and bottom are surrounded by the first selection element layer by being buried in the first groove; and a second conductive patter that overlaps the first variable resistance layer over the first variable resistance layer. Through this, fabricating processes may be simplified and memory cell characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate; an inter-layer dielectric layer formed over the substrate and patterned to include an opening; a bottom electrically conducting structure formed in the opening of the inter-layer dielectric layer to have a top surface that is in a same plane as a top surface of the inter-layer dielectric layer to provide a continuum surface provided by the inter-layer dielectric layer and electrically conducting structure; a magnetic memory cell formed over the continuum surface provided by the inter-layer dielectric layer and the bottom electrically conducting structure to fully cover the top surface of the bottom electrically conducting structure and to additionally cover a surrounding area of the top surface of the inter-layer dielectric layer that surrounds the bottom electrically conducting structure, the magnetic memory cell including a variable resistance structure that includes a free layer having a variable magnetization direction, a pinned layer having a fixed magnetization direction, and a tunnel barrier layer interposed between the free layer and the pinned layer to store data based on different resistance states; and a top electrode formed over the variable resistance structure of the magnetic memory cell so that top electrode and bottom electrically conducting structure collectively provide electrical contacts to the magnetic memory cell for storing data without an electrical leakage between the top electrode and the bottom electrically conducting structure due to the full coverage of the top surface of the bottom electrically conducting structure by the magnetic memory cell. Through this, fabricating processes may be simplified and memory cell characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAIVI), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating a semiconductor device, comprising:
    forming an inter-layer dielectric layer and a sacrificial layer over a substrate so that the sacrificial layer covers the inter-layer dielectric layer;

forming a conductive pattern that is coupled with a portion of the substrate while penetrating through the inter-layer dielectric layer and the sacrificial layer;

protruding a first portion of the conductive pattern by removing the sacrificial layer while maintaining a second portion of the conductive pattern inside the inter-layer dielectric layer;

oxidizing the protruded first portion of the conductive pattern without oxidizing the second portion of the conductive pattern;

removing the oxidized first portion of the conductive pattern to expose a top of the second portion of the conductive pattern; and forming a variable resistance element on top of the conductive pattern to couple a bottom of the variable resistance element with the top of the second portion of the conductive pattern.

2. The method of claim 1, wherein the forming of the conductive pattern includes:

forming an opening by selectively etching the inter-layer dielectric layer and the sacrificial layer;

forming a conductive material in a thickness that the opening is sufficiently filled; and polishing the conductive material until the sacrificial layer is exposed.

3. The method of claim 2, wherein the sacrificial layer has substantially the same polishing rate as the conductive material.

4. The method of claim 2, wherein the conductive material includes a metal, and the sacrificial layer includes a nitride of the metal.

5. The method of claim 1, wherein the sacrificial layer has a different etch rate from the conductive pattern and the inter-layer dielectric layer.

6. The method of claim 1, wherein a width of a lower surface of the variable resistance element is longer than a width of an upper surface of the second portion of the conductive pattern.

7. The method of claim 1, wherein the variable resistance element includes:

a free layer having a variable magnetization direction, a pinned layer having a fixed magnetization direction, and a tunnel barrier layer interposed between the free layer and the pinned layer.

8. The method of claim 1, wherein the second portion of the conductive pattern and the inter-layer dielectric layer have planarized upper surfaces.

9. The method of claim 1, wherein the oxidizing of the protruded first portion of the conductive pattern is performed concurrently with the process of removing the sacrificial layer through natural oxidation.

10. A method for fabricating a semiconductor device, comprising:

forming an inter-layer dielectric layer over a substrate;

forming a sacrificial layer over the inter-layer dielectric layer;

forming a primary bottom electrode that is coupled with a portion of the substrate while penetrating through the inter-layer dielectric layer and the sacrificial layer;

protruding a portion of the primary bottom electrode by removing the sacrificial layer;

oxidizing the protruded portion of the primary bottom electrode;

forming a bottom electrode of a variable resistance element by removing the oxidized portion of the primary bottom electrode; and forming the other constituent elements of the variable resistance element that is coupled with the bottom electrode over the bottom electrode.

11. The method of claim 10, wherein the forming of the primary bottom electrode includes:

forming an opening by selectively etching the inter-layer dielectric layer and the sacrificial layer;

forming a conductive material in a thickness that the opening is sufficiently filled; and polishing the conductive material until the sacrificial layer is exposed.

12. The method of claim 11, wherein the sacrificial layer has substantially the same polishing rate as the conductive material.

13. The method of claim 11, wherein the conductive material includes a metal, and the sacrificial layer includes a nitride of the metal.

14. The method of claim 10, wherein the sacrificial layer has a different etch rate from the primary bottom electrode and the inter-layer dielectric layer.

15. The method of claim 10, wherein a width of a lower surface of the other constituent elements of the variable resistance element is longer than a width of an upper surface of the bottom electrode.

16. The method of claim 10, wherein the other constituent elements of the variable resistance element include:

a free layer having a variable magnetization direction, a pinned layer having a fixed magnetization direction, and a tunnel barrier layer interposed between the free layer and the pinned layer.

17. The method of claim 10, wherein the bottom electrode and the inter-layer dielectric layer have planarized upper surfaces.

18. The method of claim 10, wherein the oxidizing of the protruded portion of the primary bottom electrode is performed concurrently with the process of removing the sacrificial layer through natural oxidation.

* * * * *